(12) United States Patent
Ranish

(10) Patent No.: US 11,462,396 B2
(45) Date of Patent: Oct. 4, 2022

(54) LAMP CROSS-SECTION FOR REDUCED COIL HEATING

(71) Applicant: APPLIED MATERIALS, INC., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 437 days.

(21) Appl. No.: 16/594,629

(22) Filed: Oct. 7, 2019

(65) Prior Publication Data

US 2020/0035480 A1 Jan. 30, 2020

Related U.S. Application Data

(63) Continuation of application No. 14/477,460, filed on Sep. 4, 2014, now Pat. No. 10,468,242.

(60) Provisional application No. 61/874,136, filed on Sep. 5, 2013.

(51) Int. Cl.
*H01K 1/32* (2006.01)
*H01L 21/67* (2006.01)
*H05B 3/00* (2006.01)

(52) U.S. Cl.
CPC ........ *H01K 1/325* (2013.01); *H01L 21/67115* (2013.01); *H05B 3/0047* (2013.01)

(58) Field of Classification Search
None
See application file for complete search history.

(56) References Cited

U.S. PATENT DOCUMENTS

| 606,792 | A | * | 7/1898 | Quidas | H05B 3/008 338/237 |
| 2,041,631 | A | * | 5/1936 | Athill | H05B 3/009 338/237 |
| 2,910,605 | A | * | 10/1959 | Hodge | H01K 1/24 313/274 |
| 2,980,820 | A | * | 4/1961 | Brundige | H01K 1/24 313/275 |
| 3,160,777 | A | * | 12/1964 | Holcomb | H01K 1/26 313/279 |
| 3,195,001 | A | * | 7/1965 | Hodge | H01K 1/24 313/274 |

(Continued)

FOREIGN PATENT DOCUMENTS

WO     WO 92/23591     3/2002

OTHER PUBLICATIONS

International Search Report and Written Opinion dated Dec. 16, 2014 for PCT Application No. PCT/US2014/054092.

(Continued)

*Primary Examiner* — Thor S Campbell
(74) *Attorney, Agent, or Firm* — Moser Taboada

(57) ABSTRACT

Embodiments of apparatus for providing radiant energy in the form of electromagnetic radiation are provided herein. In some embodiments a radiation source for electromagnetic radiation includes a tubular body formed from a material transparent to electromagnetic radiation; a filament disposed within the tubular body; and a reflective coating disposed on a portion of the tubular body to form a reflective portion, wherein the reflective portion is configured to minimize reflection of electromagnetic radiation emanating from the filament during use back to the filament.

20 Claims, 5 Drawing Sheets

(56) References Cited

U.S. PATENT DOCUMENTS

| | | | | | |
|---|---|---|---|---|---|
| 3,211,941 | A | * | 10/1965 | Sanden | H01K 1/24 313/274 |
| 3,223,875 | A | * | 12/1965 | Eggers | H05B 3/44 313/271 |
| 3,363,093 | A | * | 1/1968 | Heinrich | F21V 7/04 362/347 |
| 3,538,374 | A | * | 11/1970 | Kane | H01K 1/24 219/532 |
| 3,696,265 | A | * | 10/1972 | Martin | H01K 1/18 313/279 |
| 3,829,677 | A | * | 8/1974 | DeLlano | F21V 7/06 362/346 |
| 3,930,178 | A | * | 12/1975 | Coaton | H01K 1/24 313/275 |
| 3,982,145 | A | * | 9/1976 | Liptow | H01K 1/24 313/274 |
| 4,017,758 | A | * | 4/1977 | Almer | H01K 1/14 359/359 |
| 4,078,169 | A | * | 3/1978 | Armstrong | F21V 7/005 362/217.08 |
| 4,130,107 | A | * | 12/1978 | Rabi | F24S 23/80 136/246 |
| 4,320,442 | A | * | 3/1982 | McCamy | F21V 7/09 362/349 |
| 4,359,665 | A | * | 11/1982 | Morris | H01K 1/24 313/274 |
| 4,442,374 | A | * | 4/1984 | Morris | H01K 9/00 313/274 |
| 4,510,416 | A | * | 4/1985 | Meade | H01K 1/24 313/579 |
| 4,539,628 | A | * | 9/1985 | Bartenbach | F21V 11/02 362/342 |
| 4,613,787 | A | * | 9/1986 | Swain | H01K 1/24 445/32 |
| 4,626,735 | A | * | 12/1986 | Morris | H01K 9/00 313/274 |
| 4,719,546 | A | * | 1/1988 | Spitz | F21V 7/005 362/240 |
| 4,947,305 | A | * | 8/1990 | Gunter, Jr. | F21V 7/0008 362/346 |
| 4,990,788 | A | * | 2/1991 | Rabi | F21V 7/04 250/503.1 |
| 5,253,151 | A | * | 10/1993 | Mepham | G02F 1/133605 349/67 |
| 5,335,152 | A | * | 8/1994 | Winston | F24S 23/80 362/296.05 |
| 5,382,805 | A | * | 1/1995 | Fannon | H01K 1/325 250/493.1 |
| 5,565,734 | A | * | 10/1996 | Pinot | H01K 1/24 313/271 |
| 5,951,896 | A | * | 9/1999 | Mahawili | C30B 31/12 219/405 |
| 6,122,438 | A | * | 9/2000 | Scherzer | H05B 3/0038 392/407 |
| 6,186,648 | B1 | * | 2/2001 | Baker | G02B 6/0006 362/346 |
| 6,333,509 | B1 | | 12/2001 | Lumpp | |
| 6,399,955 | B1 | | 6/2002 | Fannon | |
| 6,421,503 | B2 | * | 7/2002 | Grob | H05B 3/44 392/407 |
| 6,429,579 | B1 | * | 8/2002 | Pastir | H01K 1/24 313/271 |
| 6,469,426 | B1 | * | 10/2002 | Hurst | H01K 1/24 445/27 |
| 6,583,535 | B1 | | 6/2003 | Lumpp | |
| 6,591,062 | B2 | * | 7/2003 | Scherzer | H05B 3/04 392/407 |
| 6,600,138 | B2 | * | 7/2003 | Hauf | H01L 21/67115 219/390 |
| 6,781,291 | B2 | * | 8/2004 | Halpin | H01K 1/18 313/252 |
| 6,856,078 | B2 | * | 2/2005 | Halpin | H01K 1/24 313/271 |
| 7,639,930 | B2 | * | 12/2009 | Mizukawa | H01K 9/08 392/407 |
| 7,656,079 | B2 | * | 2/2010 | Mizukawa | H01K 7/00 313/315 |
| 7,747,147 | B2 | * | 6/2010 | Konishi | H05B 3/009 392/407 |
| 8,014,652 | B2 | * | 9/2011 | Suzuki | H01L 21/67115 392/407 |
| 8,278,805 | B2 | * | 10/2012 | Monteix | H05B 3/0057 392/422 |
| 8,288,932 | B2 | * | 10/2012 | Nakashima | H01K 1/16 313/344 |
| 8,952,297 | B2 | * | 2/2015 | He | H01L 21/67115 219/390 |
| 2003/0183785 | A1 | | 10/2003 | Bar et al. | |
| 2004/0047053 | A1 | | 3/2004 | Li | |
| 2004/0156625 | A1 | * | 8/2004 | Garmer | H01L 21/67115 392/420 |
| 2005/0142875 | A1 | | 6/2005 | Yoo | |
| 2008/0203924 | A1 | * | 8/2008 | Kitagawa | H01K 7/00 315/46 |
| 2008/0298786 | A1 | * | 12/2008 | Suzuki | H01K 9/00 392/411 |
| 2008/0298787 | A1 | * | 12/2008 | Suzuki | H01K 1/16 392/411 |
| 2010/0273333 | A1 | * | 10/2010 | Kato | H01L 21/67248 392/416 |
| 2013/0126509 | A1 | | 5/2013 | He et al. | |

OTHER PUBLICATIONS

"Thermodynamically Efficient Nonimaging Optics", Roland Winston Schools of Engineering & Natural Science, University of California, Merced, Dan David Symposium, UC MERCED, Sep. 26, 2008.

"Nonimaging Optics—Wikipedia, the free encyclopedia", retrieved from http://en.wikipedia.org/wiki/Nonimaging optics on Apr. 2, 2013.

* cited by examiner

LAMP CROSS-SECTION FOR REDUCED COIL HEATING

CROSS-REFERENCE TO RELATED APPLICATIONS

This application is a continuation of co-pending U.S. patent application Ser. No. 14/477,460, filed Sep. 4, 2014, which claims benefit of U.S. provisional patent application Ser. No. 61/874,136, filed Sep. 5, 2013. Each of the aforementioned related patent applications is herein incorporated by reference in their entireties.

FIELD

Embodiments of the present invention generally relate to lamps to provide thermal energy in the form of electromagnetic radiation for use in substrate processing systems, and more particularly in semiconductor and thin film substrate processing systems.

BACKGROUND

In semiconductor and thin film fabrication, lamps are often used as a source of radiant energy to provide thermal energy for a variety of thermal processes. In some cases, it is often desirable to direct the radiant energy from the lamp by reflecting some of the radiant energy incident on a portion of the lamp tube.

In some processing systems in which some of the energy incident on the tube is reflected, some of the reflected energy may be directed toward the source of the energy, for example a coil within the lamp. The inventor has observed that reflected radiant energy incident on the coil may be absorbed by the coil, sometimes referred to as self-absorbed energy, resulting in coil heating. The self-absorbed energy may undesirably raise the temperature of the coil, which may lead to premature failure of the lamp.

Therefore, the inventor has provided embodiments of improved lamps to reduce coil heating due to reflected radiant energy incident on the coil.

SUMMARY

Embodiments of apparatus for providing radiant energy in the form of electromagnetic radiation are provided herein. In some embodiments a radiation source for electromagnetic radiation for use in a substrate processing system includes: a tubular body formed from a material transparent to electromagnetic radiation; a filament disposed within the tubular body; and a reflective coating disposed on a portion of the tubular body to form a reflective portion, wherein the reflective portion is configured to minimize reflection of electromagnetic radiation emanating from the filament during use back to the filament.

In some embodiments, a lamp tube includes: a tubular body formed from a material transparent to electromagnetic radiation comprising a reflective portion having a reflective coating wherein the reflective portion is configured to minimize reflection of incident electromagnetic radiation emanating from the source during use back to the source.

In some embodiments a substrate processing system includes: a chamber enclosing a processing volume; a support having a substrate support surface adapted to support a substrate within the processing volume; a lamp comprising a tubular body formed from a material transparent to electromagnetic radiation; a filament disposed within the tubular body; and a reflective coating disposed on a portion of the tubular body to form a reflective portion, wherein the reflective portion is configured to minimize reflection of electromagnetic radiation emanating from the filament during use back to the filament.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1A:
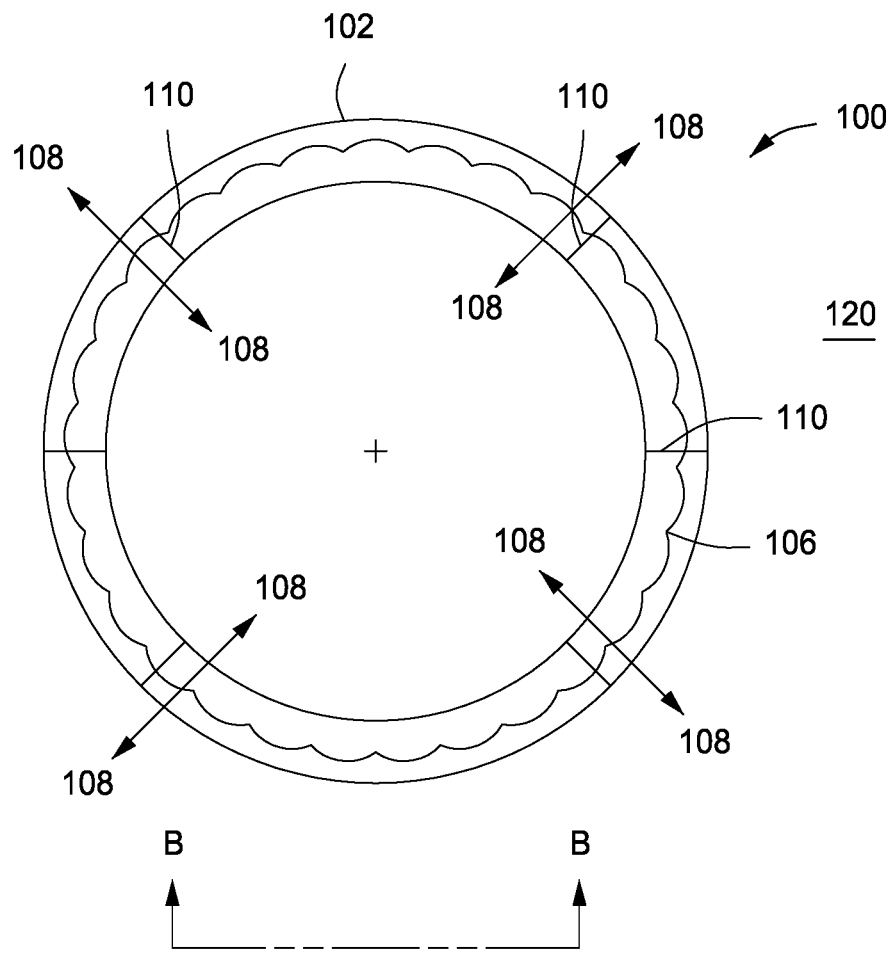
FIG. 1A depicts a plan view of a lamp in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of electromagnetic radiation sources, for example lamps, configured to reflect a portion of the electromagnetic radiation generated within the lamp in the form of radiant energy are provided herein. The radiant energy may be provided to increase the thermal energy in components of a thermal process in a processing chamber, for example, for processing substrates in semiconductor other and thin-film fabrication processes.

Figure 3:
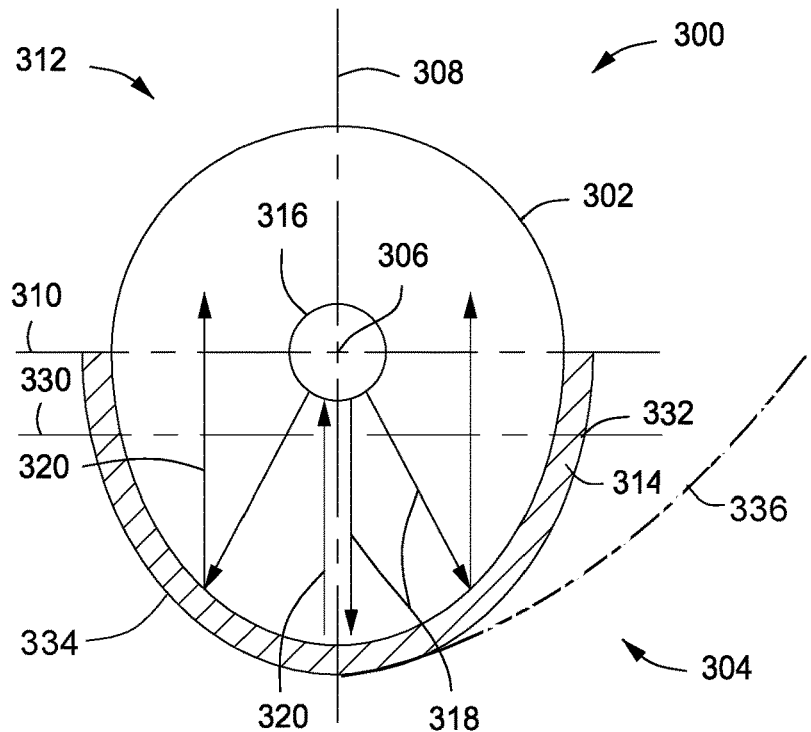
FIG. 3 depicts a cross sectional view of a lamp according to some embodiments of the present invention.

As used throughout this specification, "upper" and "lower" are meant to distinguish between two portions of the tube or lamp on opposite sides of a horizontal plane, for example the horizontal plane including axis 310 depicted in FIG. 3, although other horizontal planes may also be used to distinguish between "upper" and "lower" portions of the tube or lamp. "Upper" and "lower" are not absolutes and may change depending on the position of the lamp with respect a horizontal plane. In addition, the terms "upper" and "lower" may also refer to portions of the lamp in other orientations, for example, having non-horizontal reference planes.

FIG. 1 depicts a cross sectional view of a typical lamp, lamp 100, suitable as a source for electromagnetic radiation.

Figure 6A:
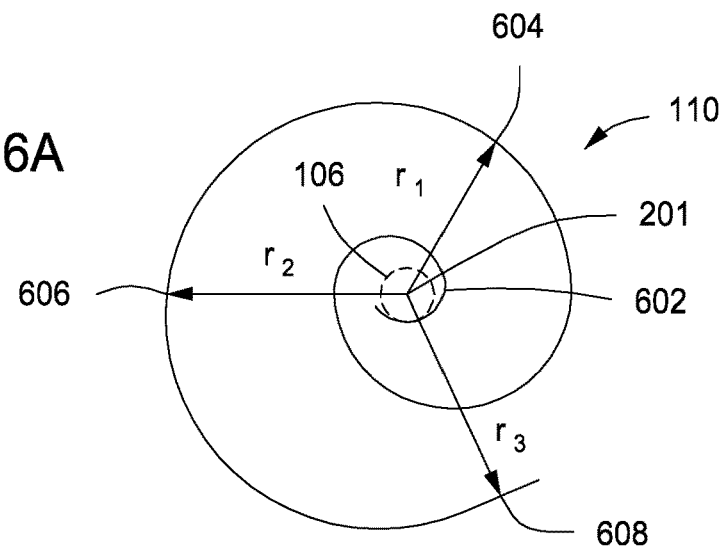
FIGS. 6A-6C respectively depict non-limiting examples of filament supports in accordance with some embodiments of the present invention.
Figure 6B:
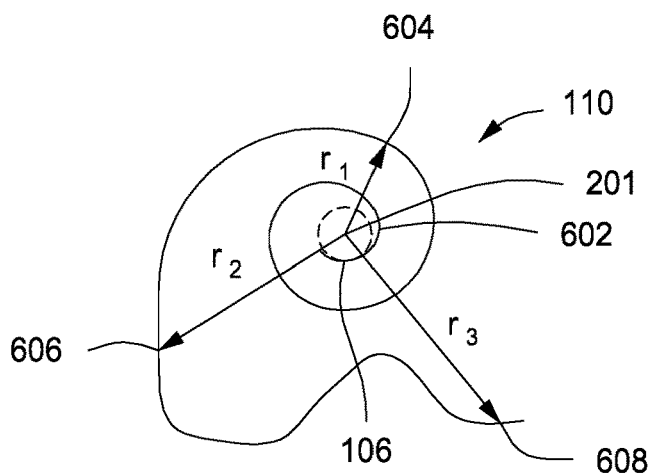
Figure 6C:
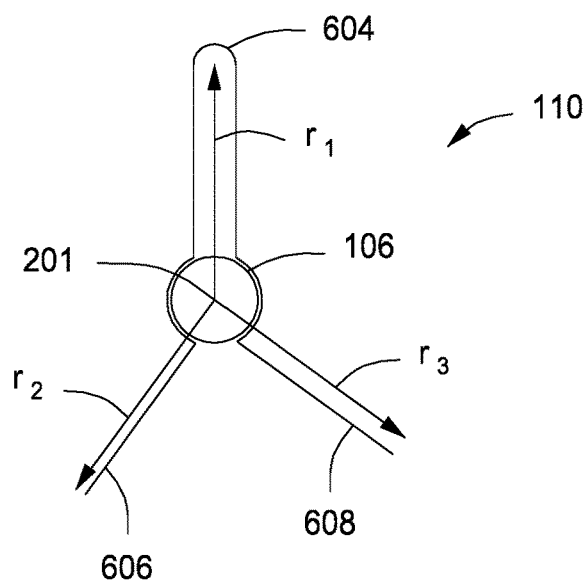

The lamp 100 comprises a tubular body or tube 102 formed from a material transparent to electromagnetic radiation, for example quartz or an aluminosilicate glass (such as GE180 glass, available from General Electric which may comprise Al, Si, Ba, Ca, O as main components). The tube 102 may be filled with an inert gas, for example argon or a substantially non reactive gas such as nitrogen, and may contain minor amounts of halogen materials to keep the interior lamp body clean A lamp filament, filament 106, is generally centrally located approximately at the center 104 of the tube 102. The location of the filament 106 within the tube 102 may be maintained by a plurality of filament supports 110 (6 shown in FIG. 1A) within the tube 102. Non-limiting examples of filament supports 110 are illustrated in FIGS. 6A-6C and discussed below.

Figure 1B:
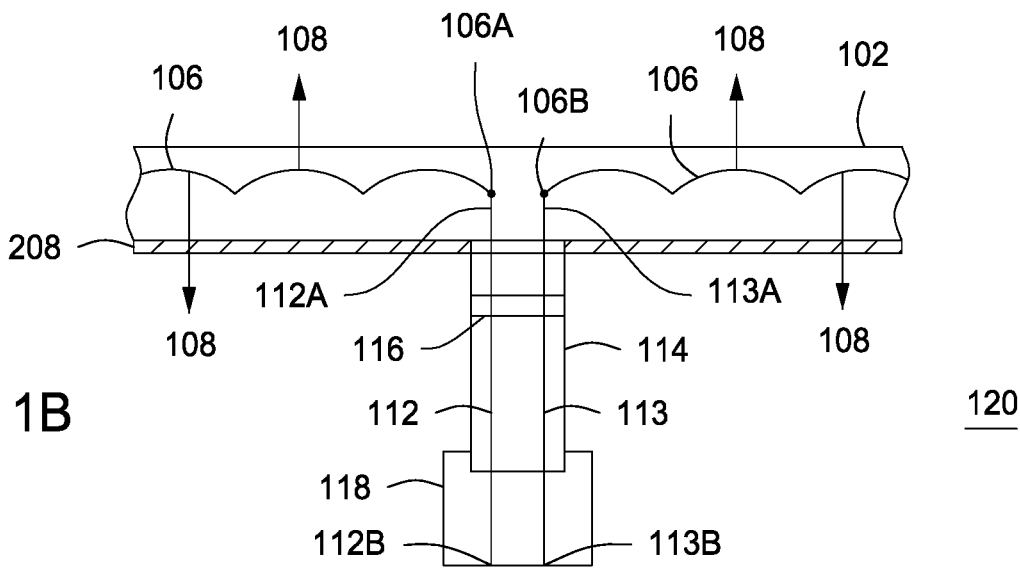
FIG. 1B depicts a side view of a portion of the lamp of FIG. 1A taken along B-B.

FIG. 1A depicts a plan view of a lamp 100 according to embodiments of the present invention. The tube 102 of the lamp 100 is illustrated as circular for ease of illustration only. Other tube shapes may include straight sections, arced sections, or straight sections and arced sections or segments. The illustrative lamp 100 of FIG. 1A is illustrated in a side view in FIG. 1B. As illustrated in FIG. 1B, power is supplied to energize the filament 106 through leads 112, 113. As illustrated in FIG. 1B, one end 106A of the filament 106 is coupled to a first end 112A of the lead 112 and another end 106B of the filament 106 is coupled to a first end 113A of the lead 113. The leads are disposed within a downwardly directed (as drawn) projection 114 of the tube 102 such that the second end 112B of the first lead 112 and the second end 113B of the lead 113 separately exit the tube 102. The leads 112, 113 may be electrically coupled at the second ends, 112B, 113B respectively, to an energy source, for example the lamp driver 514 discussed below with regard to FIG. 5. A base 118 may be electrically coupled to the second ends 112B, 113B of the leads 112, 113 and coupled to the projection 114 to facilitate coupling the second ends 112B, 113B to an energy source. The base may be a single piece, for example base 118 in FIG. 1B, coupled to both leads 112, 113. The base may also comprise individual elements separately coupled to each lead 112, 113. The leads 112, 113 are hermetically sealed within the projection 114.

A support bar 116, for example a silica bar, may be provided for positioning and support of the leads 112, 113. Alternately, power may be supplied at two approximately diametrically opposed locations (not shown) on the lamp, with a single power lead at each location. As with the two lead power supply discussed above, the leads may each be disposed in a downwardly directed projection similar to projection 114, may be positioned with a support bar 116, and are hermetically sealed within the projections.

When the filament is energized, the filament emits electromagnetic radiation radially outward from the filament as illustrated by arrows 108. Because the tube 102 is transparent to the electromagnetic radiation, the electromagnetic radiation travels through the tube 102 and into the environment 120 outside and surrounding the tube 102. The environment may be a processing volume within a processing chamber (discussed below with regard to FIG. 5).

Figure 2:
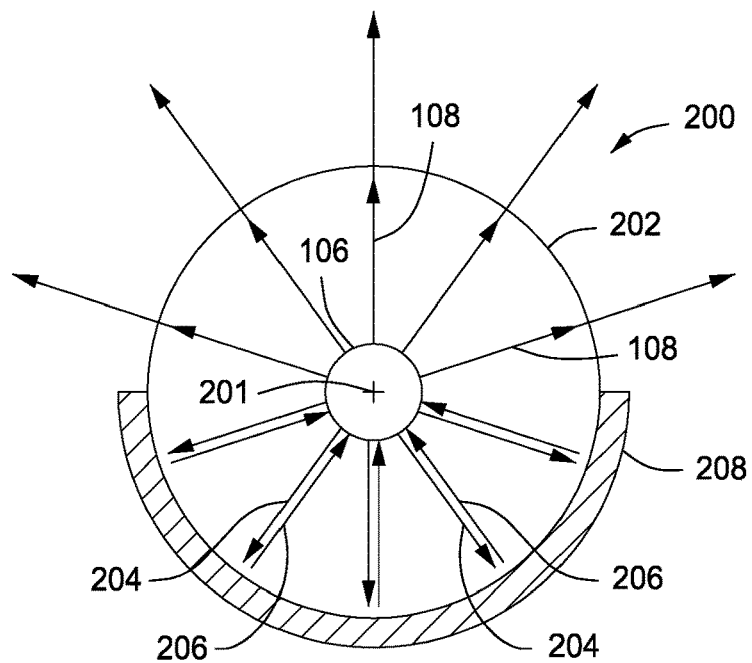
FIG. 2 depicts a cross sectional view of a conventional lamp comprising a reflective coating on a portion of the lamp tube.

In some applications, it may be desirable to direct the radiant energy from the lamp (e.g., from the energized filament 106) by blocking the transmission of the radiation into the environment in an undesired direction and reflecting the blocked energy in a desired direction. Some lamps achieve this by disposing a reflective coating on a portion of the lamp 200 as illustrated in FIG. 2. As shown, a reflective coating 208 is disposed on a lower portion of the tube 202.

The reflective coating 208 may be applied on the inside surface or the outside surface of the tube 202 and may include any suitable material, non-limiting examples of which include gold, tungsten, tantalum, niobium, silica, aluminum oxide, hafnium oxide, zirconium oxide, yttrium oxide, tantalum oxide, niobia, or boron nitride. In some embodiments, combinations of layers of different materials may be used to provide a multilayer reflective coating, for example, a multilayer dielectric stack comprised of alternating layers of tantalum oxide and silica. In some embodiments, the reflective coating 208 may have a smooth, polished surface providing a specular reflection of the incident radiation. In some embodiments, a specular, or near specular, reflective surface may have a roughness (Ra) of between about 1 and about 2 angstroms. In other embodiments, the reflective coating 208 may have an irregular or rough surface to provide a scattered or diffuse reflection. In some embodiments, a diffuse reflective surface may have a roughness (Ra) of about 1,000 angstroms. In other embodiments, the coating may contain pores or small particulate second phase and be sufficiently thick to provide reflectivity via volumetric scattering.

The inventor has noted that in some lamps 200 with a substantially circular cross section and a specular reflective coating 208 as illustrated in FIG. 2, a significant portion of the emitted radiant energy 204 is reflected (as illustrated by arrows 206) and incident upon the source of the radiation, for example the filament 106 positioned at the centerline 201 of the lamp 200. The reflected energy incident upon the filament 106 may be at least partially absorbed by the filament (i.e., self-absorbed) and raise the temperature of the filament 106, or overheat the filament 106, which can contribute to a degradation in lamp performance and decrease the useful life of the lamp 200. If the input energy is reduced to compensate for the temperature rise and maintain the design temperature of the filament 106, less energy will be radiated to the system and performance will be reduced. If the input energy is not reduced, then the filament 106 temperature will be increased above the design temperature and the design life of the lamp 200 will not be attained.

In the embodiments discussed herein, the illustrative source of the emitted radiant energy is a filament, for example filament 106. Lamps having a radiation source located along a line, such as centerline 201 of the tube 202, as disclosed herein may benefit from the present disclosure. Other sources of emitted radiation may benefit in a similar fashion from embodiments of the present disclosure.

The inventor has discovered that certain tube cross-sectional configurations can minimize reflection of electromagnetic radiation towards the filament such that filament self-absorption is also minimized. For example, certain parabolic and cardioid-like cross sectional shapes, when partially coated with a reflective coating, have been observed to minimize the reflection of electromagnetic radiation emanating from an energized filament back to the filament, reducing the amount of self-absorbed radiant energy, and therefore reducing or minimizing the undesired increase in filament temperature.

FIG. 3 illustrates a cross section of a radiation source for electromagnetic radiation, such as the lamp 300, comprising a tube 302, a lower portion 304 of which has a parabolic cross section and includes a reflective coating 314 disposed thereon.

As illustrated, the parabolic shape has the focus point 306 lying along the vertical axis, axis 308, of the parabolic portion, lower portion 304. The axis 308 may or may not be an axis of symmetry for the lower portion 304. For example, in some embodiments the left and right halves of the lower portion 304 may have different curvatures 334, 336 which may beneficially reflect incident radiation (represented by arrows 318, discussed below) in different directions.

In the non-limiting example illustrated in FIG. 3, the focus point 306 corresponds with the location of the filament 316. The parabolic shape of the lower portion 304 terminates at a horizontal plane aligned with the axis 310 which may pass through the focus point 306. In other embodiments, the parabolic shape of the lower portion 304 terminates at a plane generally parallel to axis 310 located either above or below the focus point 306. In some embodiments in which the lower portion 304, for example the parabolic shape, is not symmetrical about a vertical axis, the parabolic shape does not necessarily terminate at a horizontal plane. For example, the parabolic shape of the lower portion 304 on one side of the axis 308 may terminate on a first plane parallel to axis 310 and the parabolic shape on the other side of the axis 308 may terminate 332 at a second plane 330 parallel to axis 310 different from the first plane.

The upper portion 312 of the tube 302 may have any convenient cross-section, such as, in non-limiting examples, circular, oval, or parabolic, or combinations thereof. In the embodiments illustrated, the upper portion 312 is circular for ease of illustration only. In some embodiments, the tube 302 generally has a uniform wall thickness. In other embodiments, the wall thickness may vary due to, for example, design considerations, for example where a portion of the wall may comprise a lens, or process variations.

The reflective coating 314 may be on the outside of the lower portion 304 of the tube 302 as illustrated, or may be on the inside surface. The reflective coating 314 may be specular or diffuse (as discussed above), and may comprise any suitable material, for example the materials or combinations of materials discussed above with regard to reflective coating 208. In some embodiments, additional benefits may be realized from a specular, or substantially specular, reflective coating 314 used on lamps having a lower portion 304 formed in a parabolic shape.

The filament 316 may be any filament appropriate for thermal processing lamps. For example, the filament 316 may be a single, straight filament or may be a single helically coiled filament. In some embodiments, the filament may be a coiled coil, for example a single helically coiled filament which is then helically coiled. Multiple coils, or coiled coils, may also be used. The filament may comprise suitable process compatible materials, including non-limiting examples such as tungsten, non-sag tungsten, rhenium, tantalum, osmium, iridium, platinum, carbon, molybdenum and their alloys.

As illustrated in FIG. 3, an energized filament 316 may emit radiant energy, represented by arrows 318, that is incident on the lower portion 304, reflected by the reflective coating 314, and redirected through the upper portion 312 of the tube 302. Arrows 320 represent some of the reflected energy. The parabolic shape of the lower portion 304 reflects at least some of the energy in a direction parallel to the axis 308, as represented by arrows 320. Some radiation may be reflected from the reflective coating 314 at an obtuse angle with respect to the axis 308. Advantageously, only a limited amount of the radiant energy emitted by the filament 316 is reflected back to the filament. For example, radiant energy emitted by the filament 316 directly along the axis 308 may be reflected towards the filament 316. The parabolic cross section of the lower portion 304 further reduces the amount of energy reflected back to the filament 316, thus reducing the amount of energy self-absorbed by the filament 316, as compared to, for example, the round cross section of the lower portion represented in FIG. 2.

Figure 4:
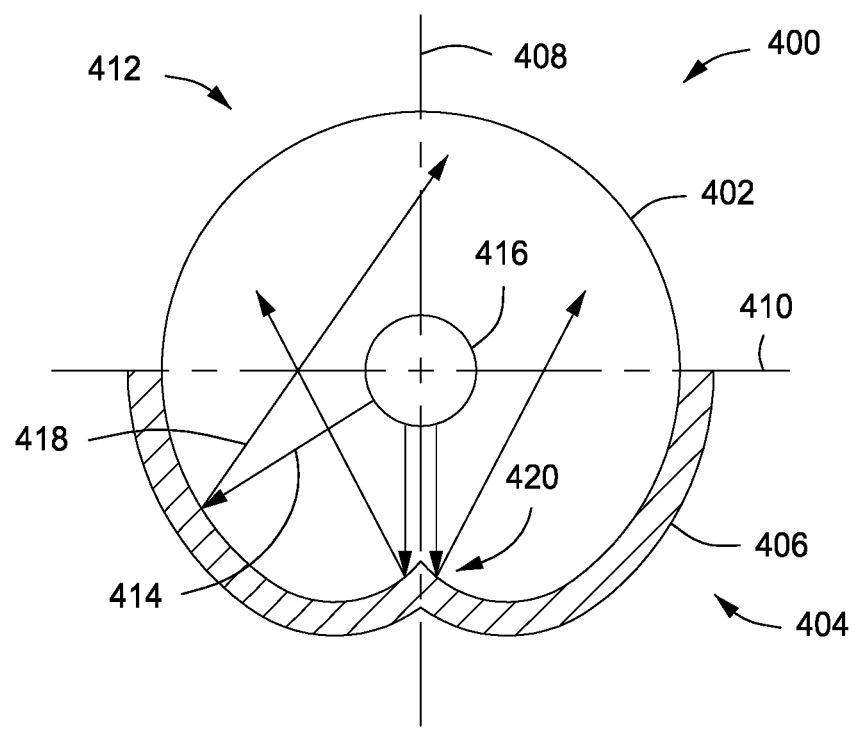
FIG. 4 depicts a cross sectional view of a lamp according to some embodiments of the present invention.

FIG. 4 is illustrative of a lamp 400 comprising a tube 402 having a lower portion 404 generally formed as a closed curved figure having an inwardly deflected portion 420, which may be a cusp, as shown, or a curvilinear surface. In some embodiments, the tube 402 is formed as, or resembling, a single cusped epicycloid, for example a cardioid, in cross section. As used herein, the terms "single cusped epicycloid" and "cardioid" are intended to mean the general shape of the tube 402 as illustrated in FIG. 4, which may deviate from the strict mathematical definitions ascribed to those terms. As illustrated, the deflected portion 420 (the single cusp as illustrated) is aligned with a vertical axis, axis 408, which is illustrated as an axis of symmetry for at least the lower portion 404, although the tube need not have an axis of symmetry. For example, in some embodiments the left and right halves of the lower portion 404 may have different curvatures which may beneficially reflect incident radiation (represented by arrows 418, discussed below) in different directions.

A reflective coating 406 may be disposed on the lower portion 404 of the lamp. The reflective coating 406 may be on an outside surface of the lower portion 404 (as illustrated) or may be on an inside surface. The reflective coating 406 may be of similar composition, construction, and surface roughness as the reflective coatings 314 discussed above.

In embodiments in which the shape of the tube 402 deviates from a cardioid, the upper portion 412 may have any convenient cross section, such as, in non-limiting examples, circular, oval, or parabolic, or combinations thereof, while the lower portion 404 maintains the deflected portion 420 as illustrated. In the embodiments illustrated, the upper portion 412 is depicted as circular for ease of illustration only. In some embodiments, the tube 402 generally has a uniform wall thickness. In other embodiments, the wall thickness may vary due to, for example, design considerations such as incorporation of a lens, or process variations.

In the non-limiting embodiment of FIG. 4, the cardioid cross section of the lower portion 404 terminates at a horizontal plane aligned with the axis 410. In other embodiments, the cardioid cross section of the lower portion 404 terminates at a plane generally parallel to axis 410 located either above or below the axis 410. In some embodiments in which the lower portion 404 is not symmetrical about a vertical axis, axis 408, the left and right (as drawn) sides of the cardioid shape do not necessarily terminate at a horizontal plane or do not terminate at the same plane. For example, the cardioid shape on one side of the axis 408 may terminate on a first plane and the cardioid shape on the other side of the axis 408 may terminate at a second plane different from the first plane.

As illustrated in FIG. 4, the filament 416 is centrally located within the tube 402. The filament may be located at any position within the tube 402 beneficial to the output of energy from the lamp 400. The filament may be of any suitable construction, for example, the filament may be a straight wire, a coiled wire, or a coiled coil as described above, and may comprise process compatible materials, including any of the non-limiting examples described above.

As illustrated in FIG. 4, an energized filament 416 emits radiant energy, represented by arrows 414, incident on the lower portion 404 and reflected by the reflective coating 406 disposed thereon. The reflected energy, represented by arrows 418, is directed towards the upper portion 412 of the tube 402. For ease of illustration only, radiant energy, represented by arrows 414, are shown as being reflected only once within the lamp. In some embodiments, incident radiation may be reflected more than once before exiting the lamp 400. Advantageously, some cardioid shapes with a reflective coating suitable for radiant energy, i.e., reflective cardioids, have been observed to reflect the incident radiant energy such that all, or substantially all, of the reflected energy bypasses the filament 416 and exits the tube 402 through the upper portion 412.

Embodiments of the present disclosure may include filament supports 110 as illustrated in FIGS. 6A-6C. The filament supports 110 comprise a central portion 602 configured to engage the filament 106 (e.g., the filament at least rests upon a portion of the central portion 602). The filament supports 110 may comprise a plurality of tube contact portions, for example tube contact portions 604, 606, 608 configured to contact the inner surface of the tube (202, 302, 402). Tube contact portions 604, 606, 608 may each be spaced from the center of the coil 201 a distance, for example distances r1, r2, and r3, respectively. The distances r1, r2, r3 are selected to position the filament 106 at a desired location within the tube (202, 302, 402), such as along a central axis or some other desired location. In some embodiments, the distances r1, r2, r3 are the same, while in other embodiments one distance may differ from the others, or each distance may be different, to adequately support the coil dependent upon the shape of the tube.

Figure 5:
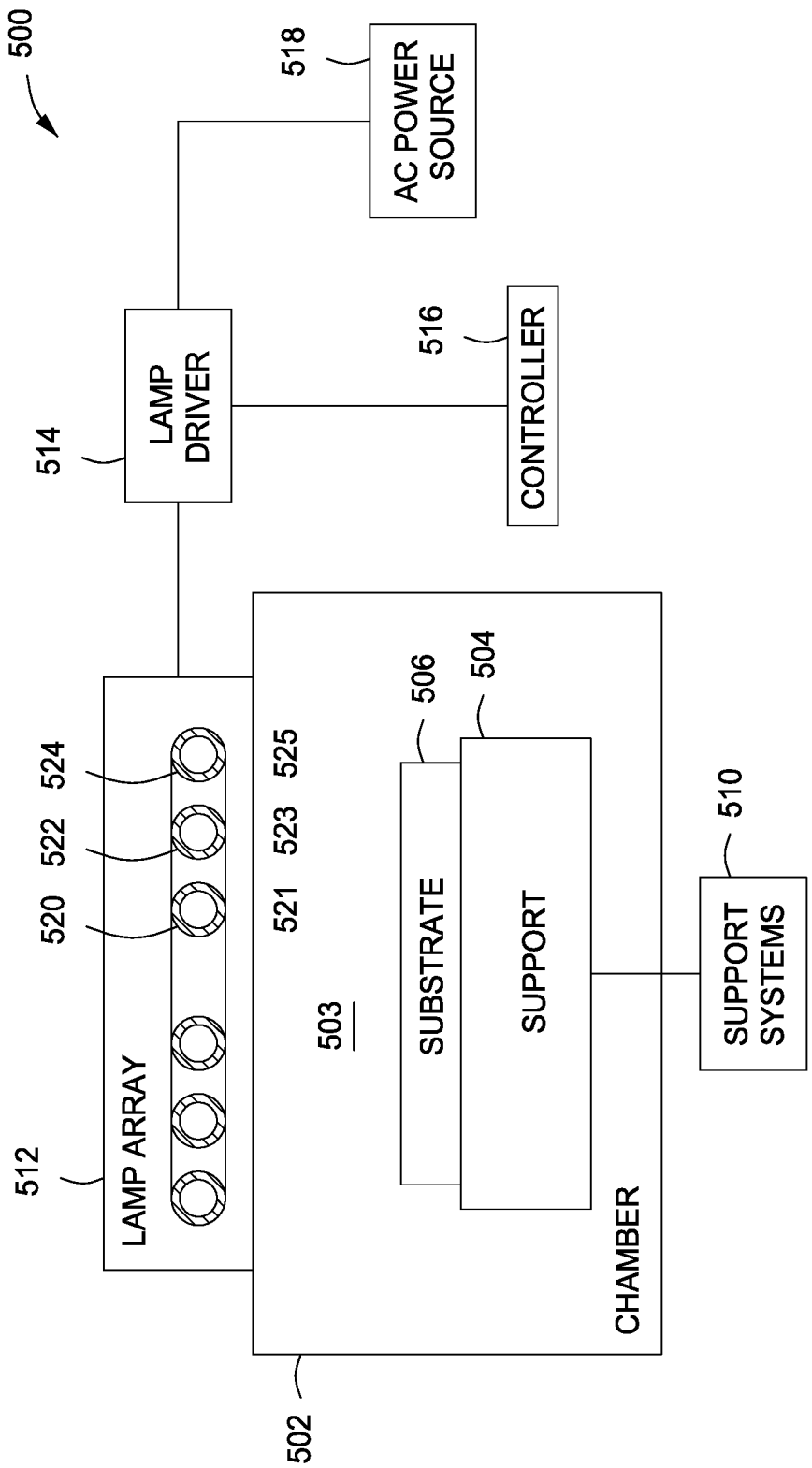
FIG. 5 depicts a block diagram of a substrate processing apparatus mps in accordance with some embodiments of the present invention.

Embodiments of the instant lamps may be included in a substrate processing system, for example a thermal processing system such as the rapid thermal processing (RTP) system 500 of FIG. 5. Other processing systems may similarly benefit from use of embodiments of the disclosed lamps. FIG. 5 depicts a block diagram of a substrate processing system 500 in accordance with embodiments of the present invention. Although the specific configuration of the apparatus on the substrate processing system 500 shown in FIG. 5 is suitable for RTP, embodiments of the disclosed lamps may be suitable for other substrate process chambers that use lamps for heating, such as chemical vapor deposition (CVD) or the like. As depicted in FIG. 5, the substrate processing system 500 comprises a chamber 502 enclosing a processing volume 503, a support 504 for a substrate 506, support systems 510, lamp array 512, lamp driver 514, controller 516, and an AC power source 518. One or more temperature sensors ad associated hardware (not shown) may be provided and coupled to the controller for controlling the temperature within the processing volume 503. The substrate 506 is, for example, a semiconductor wafer. The support 504 holds the substrate 506 so that it may be thermally processed in the processing volume 503. The support systems 510 control the support and allows for adjustment of the support 504 position, and in turn, the position of the substrate 506.

The AC power source 518 delivers AC power to the lamp driver 514, the operation of which is controlled by the controller 516. The lamp driver 514 distributes power to the lamp array 512. In turn, the lamp array 512 produces heat to thermally process the substrate 506 within the chamber 502.

In some embodiments, the lamp array 512 comprises one or more lamps, each may be individually controlled by the controller 516 through the lamp driver 514. As illustrated in FIG. 5, three lamps (520, 522, 524) are shown, although a lesser number or a greater number of lamps may be used. In some embodiments, 12 lamps may be used.

Each lamp 520, 522, 524 may be individually controlled by the controller 516 to provide heat to heating zones 521, 523, 525, respectively. Because the lamps may be individually controlled, the temperature in the heating zones may also be controlled.

Thus, embodiments of electromagnetic radiation sources, for example lamps, configured to reflect a portion of the electromagnetic radiation generated within the lamp in the form of radiant energy are provided herein. Elements of the above-described embodiments may be combined in various ways to advantageously provide combinations of benefits provided by the different elements. For example, in some embodiments, a lamp tube may be provided that includes a tubular body formed from a material transparent to electromagnetic radiation and comprising a reflective portion having a reflective coating, wherein the reflective portion is configured to minimize the reflection of incident electromagnetic radiation emanating from a source during use back to the source.

In some embodiments, a portion of the reflective portion is formed as a closed curved figure having an inwardly deflected portion. In any of the preceding embodiments, at least a portion of the reflective portion is formed as a parabola. In any of the preceding embodiments, the reflective coating is a specular coating or a diffuse coating. In any of the preceding embodiments, the reflective coating is applied to an outside surface of the tubular body. In any of the preceding embodiments, the tubular body is formed from quartz or an aluminosilicate glass. In any of the preceding embodiments, the tubular body can include straight sections, arced sections, or straight and arced sections. In any of the preceding embodiments, the source comprises a filament.

In some embodiments, a radiation source for electromagnetic radiation is provided and may include a tubular body formed from a material transparent to electromagnetic radiation; a filament disposed within the tubular body; and a reflective coating disposed on a portion of the tubular body to form a reflective portion, wherein the reflective portion is configured to minimize reflection of electromagnetic radiation emanating from the filament during use back to the filament. The radiation source may also include any of the variations and combination disclosed above with respect to the lamp tube.

In any of the preceding embodiments, the radiation source may further include a first lead having a first end coupled to a first portion of the filament and a second end exiting the tubular body at a first point; and a second lead having a first end coupled to a second portion of the filament and a second end exiting the tubular body at a second point. In some embodiments, a first base may be electrically coupled to the second end of the first lead and coupled to the tubular body; and a second base may be electrically coupled to an end of the second lead and coupled to the tubular body.

In some embodiments, a substrate processing system is provided that may include a chamber enclosing a processing volume; a support having a substrate support surface adapted to support a substrate within the processing volume; a lamp comprising a tubular body formed from a material transparent to electromagnetic radiation; a filament disposed within the tubular body; and a reflective coating disposed on a portion of the tubular body to form a reflective portion, wherein the reflective portion is configured to minimize reflection of electromagnetic radiation emanating from the filament during use back to the filament. The substrate processing system may include any of the embodiments of the lamp tube or the radiation source as discussed above.

While the foregoing is directed to embodiments of the present invention, other and further embodiments of the invention may be devised without departing from the basic scope thereof.

The invention claimed is:

1. A radiation source for electromagnetic radiation in a substrate processing system, comprising:
   a tubular body formed from a material transparent to electromagnetic radiation, the tubular body has an upper portion with a circular cross-section and a lower portion with a non-circular cross-section;
   a filament sealed within the tubular body, wherein the filament is positioned at a center point of a line that intersects at transition points between the upper portion and the lower portion;
   at least one support that holds the filament in a position within the tubular body, wherein a central portion of the at least one support interacts with the filament and a plurality of contact portions of the at least one support interact with an inner surface of the tubular body, wherein radial distances of the plurality of contact portions relative to the filament vary in distance, wherein each of the at least one support is a continuous support that circumnavigates the filament a plurality of times; and
   a reflective coating disposed on at least a portion of the lower portion of the tubular body to form a reflective portion, wherein the reflective portion is configured to direct reflections of electromagnetic radiation emanating from the filament during use away from the filament.

2. The radiation source of claim 1, wherein the tubular body is filled with an inert gas and halogen materials which are configured to maintain cleanliness of an interior of the tubular body.

3. The radiation source of claim 2, wherein the inert gas is an argon gas or a nitrogen gas.

4. The radiation source of claim 1, wherein the filament is a helix coil or a helix coil coiled around a helix coil.

5. The radiation source of claim 1, wherein the reflective coating is one of a specular coating or a diffuse coating.

6. The radiation source of claim 1, wherein the reflective coating is disposed on an outside surface of the tubular body.

7. The radiation source of claim 1, wherein the tubular body is formed from quartz or an aluminosilicate glass.

8. The radiation source of claim 1, wherein the tubular body comprises straight sections, arced sections, or straight and arced sections.

9. The radiation source of claim 1, wherein the lower portion has a parabolic cross-section.

10. The radiation source of claim 1, wherein the lower portion has a closed curve cross-section with an inwardly deflected portion.

11. An apparatus for providing electromagnetic radiation in a substrate processing system, comprising:
    a circular lamp comprising a tubular body formed from a material transparent to electromagnetic radiation, the tubular body has an upper portion with a circular cross-section and a lower portion with a non-circular cross-section;
    a filament disposed within the tubular body; and
    a reflective coating disposed on a portion of the tubular body to form a reflective portion, wherein the reflective portion is configured to direct reflections of electromagnetic radiation emanating from the filament during use away from the filament, wherein the reflective portion of the tubular body is asymmetrical to a non-reflective portion of the tubular body, and wherein a center point of the filament forms an intersection point of an axis through the circular lamp with the reflective portion and the non-reflective portion on opposite sides of the axis, and wherein a position of the filament relative to the reflective portion reduces reflective heating of the filament from the filament itself.

12. The apparatus of claim 11, wherein the reflective portion is at least partially formed as a closed curved figure having an inwardly deflected portion.

13. The apparatus of claim 11, wherein the reflective portion is at least partially formed in a shape of a parabola.

14. The apparatus of claim 11, wherein the reflective coating is one of a specular coating or a diffuse coating.

15. The apparatus of claim 11, wherein the reflective coating is applied to an outside surface of the tubular body.

16. The apparatus of claim 11, further comprising:
    a first lead having a first end coupled to a first portion of the filament and a second end exiting the tubular body at a first point; and
    a second lead having a first end coupled to a second portion of the filament and a second end exiting the tubular body at a second point.

17. The apparatus of claim 16, further comprising:
    a first base electrically coupled to the second end of the first lead and coupled to the tubular body; and
    a second base electrically coupled to an end of the second lead and coupled to the tubular body.

18. The apparatus of claim 11, wherein the tubular body is formed from quartz or an aluminosilicate glass.

19. A substrate processing system, comprising:
    a chamber enclosing a processing volume;
    a support having a substrate support surface adapted to support a substrate within the processing volume;
    a lamp array configured to direct electromagnetic radiation towards the substrate when present on the substrate support surface, wherein the lamp array has multiple lamps with each lamp having a tubular body formed from a material transparent to electromagnetic radiation with an upper portion with a circular cross-section and a lower portion with a non-circular cross-section, a filament disposed within the tubular body, and a reflective coating disposed on a portion of the tubular body to form a reflective portion, and wherein the reflective portion of the tubular body is configured to direct reflections of electromagnetic radiation emanating from the filament away from the filament and wherein a position of the filament relative to the reflective portion reduces reflective heating of the filament from the filament itself; and
    a controller that interacts with the lamp array and is configured to adjust electromagnetic radiation output of each lamp individually through AC power changes.

20. The substrate processing system of claim 19, further comprising:
    at least one support that holds the filament in a position within the tubular body, wherein a central portion of the at least one support interacts with the filament and a plurality of contact portions of the at least one support interact with an inner surface of the tubular body, wherein radial distances of the plurality of contact portions measured from the filament vary in distance.

* * * * *